(12) United States Patent
Park et al.

(10) Patent No.: US 10,659,712 B2
(45) Date of Patent: May 19, 2020

(54) SIGNAL TRANSFER CIRCUIT AND IMAGE SENSOR INCLUDING THE SAME

(71) Applicant: SAMSUNG ELECTRONICS CO., LTD., Suwon-si (KR)

(72) Inventors: Seok-Yong Park, Hwaseong-si (KR); Hee-Sung Chae, Seoul (KR)

(73) Assignee: SAMSUNG ELECTRONCIS CO., LTD., Suwon-si (KR)

( * ) Notice: Subject to any disclaimer, the term of this patent is extended or adjusted under 35 U.S.C. 154(b) by 234 days.

(21) Appl. No.: 15/867,876

(22) Filed: Jan. 11, 2018

(65) Prior Publication Data

US 2018/0359442 A1    Dec. 13, 2018

(30) Foreign Application Priority Data

Jun. 9, 2017 (KR) .................. 10-2017-0072252

(51) Int. Cl.
| | | |
|---|---|---|
| *H04N 5/378* | (2011.01) | |
| *H03F 3/45* | (2006.01) | |
| *H04N 5/374* | (2011.01) | |
| *H04N 5/365* | (2011.01) | |
| *H03F 3/26* | (2006.01) | |

(52) U.S. Cl.
CPC ............ *H04N 5/378* (2013.01); *H03F 3/265* (2013.01); *H03F 3/45179* (2013.01); *H03F 3/45273* (2013.01); *H03F 3/45475* (2013.01); *H04N 5/365* (2013.01); *H04N 5/374* (2013.01); *H03F 2200/288* (2013.01); *H03F 2200/303* (2013.01); *H03F 2203/45051* (2013.01); *H03F 2203/45101* (2013.01)

(58) Field of Classification Search
CPC .......... H04N 5/374–37457; H04N 5/335–378; H01L 27/14643–14663; H01L 27/146–14893; H03F 3/28; H03F 3/36; H03F 1/50; H03F 2200/372; H03F 2200/294; H03F 3/45475; H03F 2200/451; H03F 1/26; H03H 7/42; H03H 11/32

See application file for complete search history.

(56) References Cited

U.S. PATENT DOCUMENTS

| | | |
|---|---|---|
| 6,452,152 B1 | 9/2002 | Yang |
| 7,518,411 B2 | 4/2009 | Kim et al. |
| 7,768,321 B2 | 8/2010 | Chang et al. |

(Continued)

*Primary Examiner* — Daniel M Pasiewicz
*Assistant Examiner* — Selam T Gebriel
(74) *Attorney, Agent, or Firm* — Sughrue Mion, PLLC

(57) ABSTRACT

A signal transfer circuit includes a transmission circuit, a conversion circuit and a sensing output circuit. The transmission circuit outputs a driving signal to a signal line. The conversion circuit receives an input signal that is a single-ended signal transferred through the signal line and converts the input signal to a differential signal including a first output amplified signal and a second output amplified signal. The first output amplified signal swings downwardly from a first output DC level and the second output amplified signal swings upwardly from a second output DC level that is lower than the first output DC level. The sensing output circuit generates an output signal based on the differential signal. The number of the signal lines is reduced without decrease in performance of signal transfer, and sizes of the signal transfer circuit and the device including the signal transfer circuit are reduced.

16 Claims, 13 Drawing Sheets

(56) References Cited

U.S. PATENT DOCUMENTS

| | | |
|---|---|---|
| 7,859,926 B2 | 12/2010 | Takami |
| 8,363,139 B2 | 1/2013 | Taura |
| 8,432,761 B2 | 4/2013 | Kim et al. |
| 10,277,216 B1 * | 4/2019 | Nguyen ................ H03F 3/4521 |
| 2004/0000955 A1 * | 1/2004 | Wang ................ H03F 3/45188 |
| | | 330/301 |
| 2006/0049852 A1 | 3/2006 | Park et al. |
| 2008/0284885 A1 * | 11/2008 | Taura ................ H04N 5/3575 |
| | | 348/300 |
| 2010/0060765 A1 * | 3/2010 | Kim ................ G11C 7/065 |
| | | 348/308 |
| 2012/0319781 A1 * | 12/2012 | Scott ................ G11C 7/067 |
| | | 330/310 |

* cited by examiner though a signal line is received. The input signal is converted to a differential signal including a first output amplified signal and a second output amplified signal, such that the first output amplified signal swings downwardly from a first output DC level and the second output amplified signal swings upwardly from a second output DC level that is lower than the first output DC level. The output signal is generated based on the differential signal.

SIGNAL TRANSFER CIRCUIT AND IMAGE SENSOR INCLUDING THE SAME

CROSS-REFERENCE TO RELATED APPLICATION

This application claims priority from Korean Patent Application No. 10-2017-0072252, filed on Jun. 9, 2017 in the Korean Intellectual Property Office (KIPO), the disclosure of which is incorporated herein by reference in its entirety.

BACKGROUND

1. Field

Example embodiments relate generally to semiconductor integrated circuits, and more particularly to a signal transfer circuit, an image sensor including the signal transfer circuit and a method of transferring a signal.

2. Related Art

An image sensor is an image pickup device using a semiconductor responsive to light. The image sensor may have a very large number of pixels that respectively detect light. Each pixel may convert photons to electro-hole pairs to accumulate a charge, and the amount of accumulated charge depends on light intensity and illumination time interval. As such the image sensor may convert the incident light into electric quantity.

Recently the number of pixels is increasing significantly, and an operation frequency of a data bus included in the image sensor approaches a limit value. The limit of the operation frequency may be overcome by increasing the number of bus channels, but in this case the size of the image sensor increases.

SUMMARY

Some example embodiments may provide a signal transfer circuit and an image sensor including the signal transfer circuit for reducing the number of signal lines.

Some example embodiments may provide a method of transferring a signal for reducing the number of signal lines.

According to example embodiments, a signal transfer circuit includes a transmission circuit, a conversion circuit and a sensing output circuit. The transmission circuit outputs a driving signal to a signal line. The conversion circuit receives an input signal that is a single-ended signal transferred through the signal line and converts the input signal to a differential signal including a first output amplified signal and a second output amplified signal. The first output amplified signal swings downwardly from a first output DC level and the second output amplified signal swings upwardly from a second output DC level that is lower than the first output DC level. The sensing output circuit generates an output signal based on the differential signal.

According to example embodiments, an image sensor includes a pixel array, a pixel array, an analog-digital converter and a signal transfer circuit. The pixel array includes a plurality of pixels configured convert incident lights to electrical analog signals. The analog-digital converter converts the electrical analog signals to digital data. The signal transfer circuit transfers the digital data to an external device. The signal transfer circuit includes a transmission circuit, a conversion circuit and a sensing output circuit as described above.

In a method of transferring a signal according to example embodiments, an input signal that is a single-ended signal The signal transfer circuit according to example embodiments transfers a single-ended signal through one signal line and generates a differential signal using the single-ended signal for a sensing operation. Thus the number of the signal lines may be reduced without decrease in performance of signal transfer, and sizes of the signal transfer circuit and the device including the signal transfer circuit may be reduced.

BRIEF DESCRIPTION OF THE DRAWINGS

Example embodiments of the present disclosure will be more clearly understood from the following detailed description taken in conjunction with the accompanying drawings.

DETAILED DESCRIPTION OF EXAMPLE EMBODIMENTS

Figure 1:
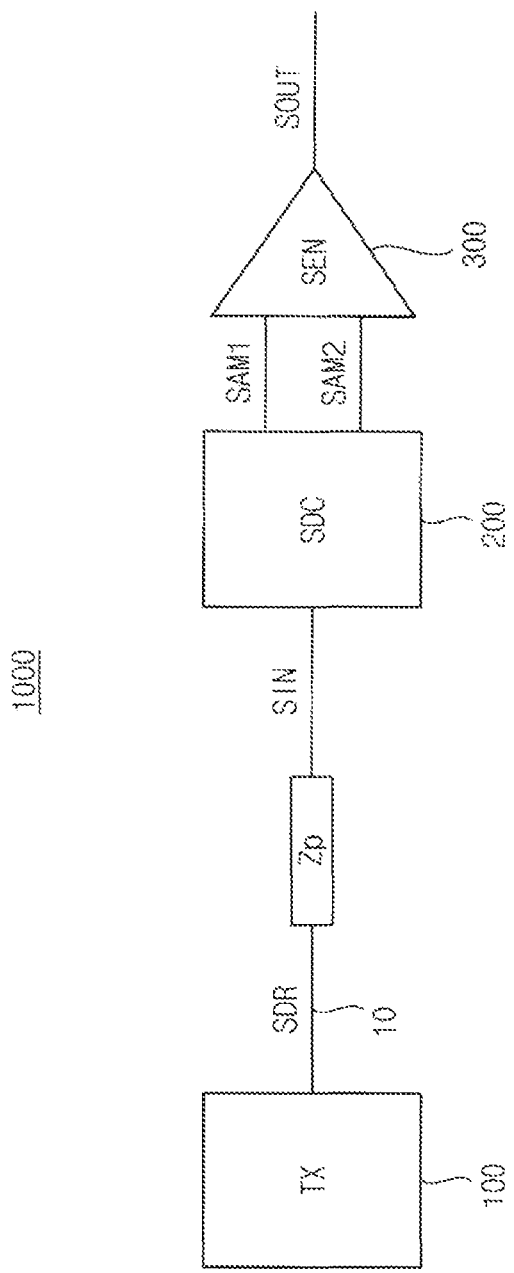
FIG. 1 is a block diagram illustrating a signal transfer circuit according to example embodiments.

Various example embodiments will be described more fully hereinafter with reference to the accompanying drawings, in which some example embodiments are shown. In the drawings, like numerals refer to like elements throughout. The repeated descriptions may be omitted.

Figure 2:
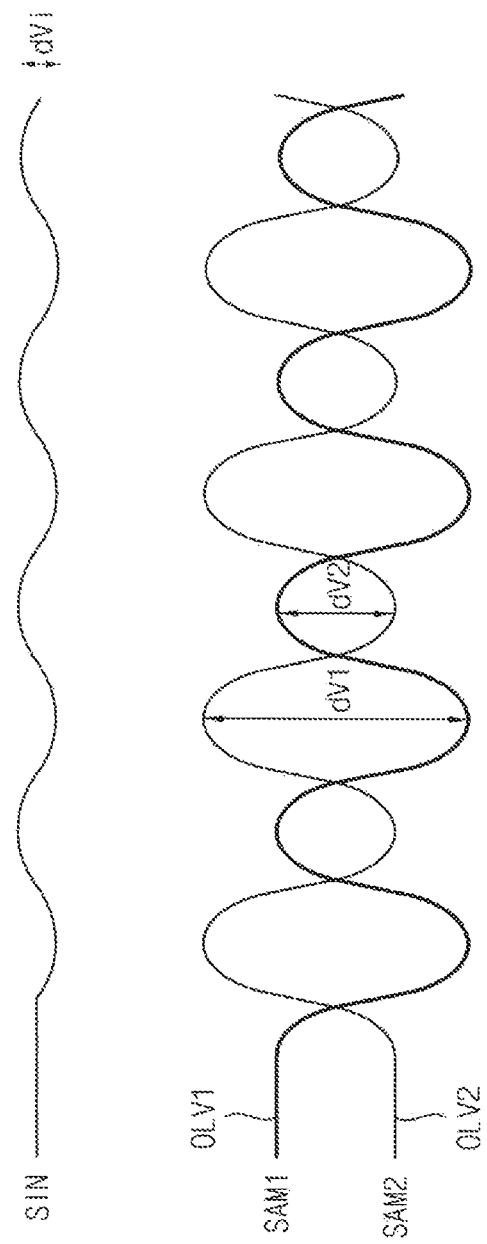
FIG. 2 is a waveform diagram illustrating an operation of a conversion circuit included in the signal transfer circuit of FIG. 1.

FIG. 1 is a block diagram illustrating a signal transfer circuit according to example embodiment, and FIG. 2 is a waveform diagram illustrating an operation of a conversion circuit included in the signal transfer circuit of FIG. 1.

Referring to FIG. 1, a signal transfer circuit 1000 includes a transmission circuit TX 100, a conversion circuit SDC 200 and a sensing output circuit SEN 300.

The transmission circuit 100 outputs a driving signal SDR to a signal line 10. The transmission circuit 100 may drive the signal line 10 by various methods. In some example embodiments, as will be described below with reference to FIG. 8, the transmission circuit 100 may output the driving signal SDR to the signal line 10 using a pull-down scheme. The signal characteristics of the output driving signal SDR may be degenerated due to impedance Zp of the signal line 10, and thus the conversion circuit 200 may receive, through the signal line 10, an input signal SIN that is distorted from the original driving signal SDR.

The conversion circuit 200 converts the input signal SIN, that is a single-ended signal, to a differential signal including a first output amplified signal SAM1 and a second output amplified signal SAM2. The first output amplified signal SAM1 and the second output amplified signal SAM2 swing complementarily. "Complementary swinging of two signals" indicates that a level of one signal increases when a level of the other signal decreases and the level of the one signal decreases when the level of the other signal increases.

As illustrated in FIG. 2, the first output amplified signal SAM1 has a first output direct current (DC) level OLV1 and swings downwardly from the first output DC level OLV1, and the second output amplified signal SAM2 has a second output DC level and swings upwardly from the second output DC level.

"Upward swinging" or "downward swing" indicates a swinging operation as follows. The first output amplified signal SAM1 may maintain the first output DC level OLV1 when the input signal SIN is disabled, and the level of the first output amplified signal SAM1 may be decreased lower than or recovered to the first output DC level OLV1 according to the change of the input signal SIN. The second output amplified signal SAM2 may maintain the second output DC level OLV2 when the input signal SIN is disabled, and the level of the second output amplified signal SAM2 may be increased higher than or recovered to the second output DC level OLV2 according to the change of the input signal SIN.

The first output amplified signal SAM1 and the second output amplified signal SAM2 have the respective DC levels and swing downwardly and upwardly from the respective DC levels. Thus the first output amplified signal SAM1 and the second output amplified signal SAM2 are distinguished from a differential signal that swings fully between two DC levels. In other words, the first output amplified signal SAM1 and the second output amplified signal SAM2 have characteristics different from a differential signal that is generated simply using inverters.

The sensing output circuit 300 generates an output signal SOUT based on the differential signal. The sensing output circuit 300 may have various configurations to sense and amplify the differential signal. In some example embodiments, the output signal SOUT may swing fully between a power supply voltage and a ground voltage of the sensing output circuit 300.

The input signal SIN may have a relatively small swing width dVi for high speed transfer and thus it may not be easy to directly sense the input signal SIN. The conversion circuit 200 may amplify and convert the input signal SIN having the small swing width dVi to generate the first output amplified signal SAM1 and the second output amplified signal SAM2 such that voltage level differences dV1 and dV2 for sensing may be increased sufficiently.

The number of data channels in an electronic device such as an image sensor is increasing according to a high speed operation, and a size of the electronic device is increasing. In general, two signal lines per channel are required for differential sensing and amplifying. Many signal lines increase the size of the electronic device and decrease design margin of the electronic device.

To reduce the number of signal lines, a single-ended signal may be transferred using one signal line and the sensing and amplifying operation may be performed by comparing the single-ended signal with a fixed reference voltage. In this case, however, performance of signal transfer may be degraded in a high speed operation in comparison with differential signaling.

The signal transfer circuit according to example embodiments transfers a single-ended signal through one signal line and generates a differential signal using the single-ended signal for a sensing operation. Thus the number of the signal lines may be reduced without decrease in performance of signal transfer, and sizes of the signal transfer circuit and the device including the signal transfer circuit may be reduced.

Figure 3:
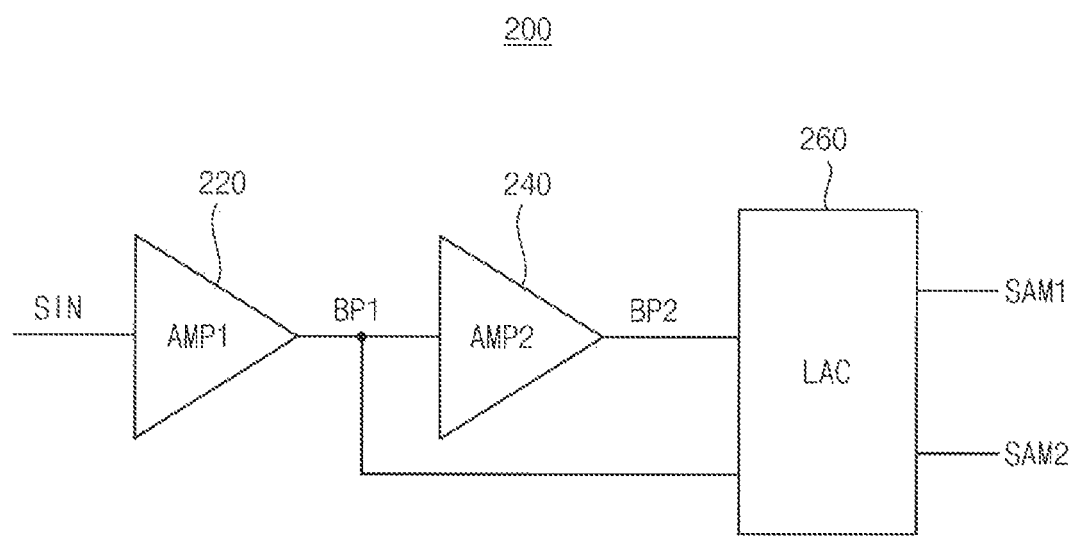
FIG. 3 is a block diagram illustrating a conversion circuit according to example embodiments.

FIG. 3 is a block diagram illustrating a conversion circuit according to example embodiments.

Referring to FIG. 3, a conversion circuit 200 includes a first amplifier AMP1 220, a second amplifier AMP2 240 and a level adjustment circuit LAC 260.

The first amplifier 220 may amplify the input signal SIN to generate a first intermediate amplified signal BP1 that swings downwardly from a first intermediate DC level ILV1. The second amplifier 240 may amplify the first intermediate amplified signal BP1 to generate a second intermediate amplified signal BP2 that swings upwardly from a second intermediate DC level ILV2. The level adjustment circuit 260 may adjust the first intermediate DC level ILV1 of the first intermediate amplified signal BP1 and the second intermediate DC level ILV2 of the second intermediate amplified signal BP2 to generate the first output amplified signal SAM1 and the second output amplified signal SAM2.

As described above, the first output amplified signal SAM1 has the first output DC level OLV1 and swings downwardly from the first output DC level OLV1, and the second output amplified signal SAM2 has the second output DC level and swings upwardly from the second output DC level. Operations of a signal transfer circuit using the conversion circuit 200 of FIG. 3 will be described below with reference to FIG. 9.

Figure 4:
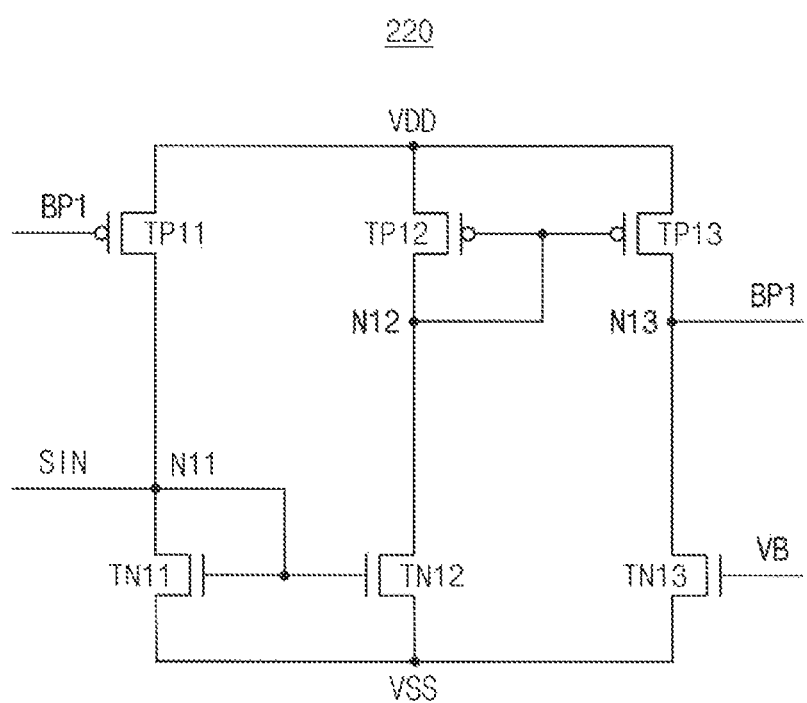
FIG. 4 is a circuit diagram illustrating an example embodiment of a first amplifier included in the conversion circuit of FIG. 3.

FIG. 4 is a circuit diagram illustrating an example embodiment of a first amplifier included in the conversion circuit of FIG. 3.

Referring to FIG. 4, a first amplifier 220 includes a first p-channel metal oxide semiconductor (PMOS) transistor TP11, a second PMOS transistor TP12, a third PMOS transistor TP13, a first n-channel metal oxide semiconductor (NMOS) transistor TN11, a second NMOS transistor TN12 and a third NMOS transistor TN13.

The first PMOS transistor TP11 has a source electrode connected to a power supply voltage VDD, a drain electrode connected to a first node N11 receiving the input signal SIN and a gate electrode receiving the first intermediate amplified signal BP1.

The first NMOS transistor TN11 has a source electrode connected a ground voltage VSS, a drain electrode connected to the first node N11 and a gate electrode connected to the first node N11.

The second PMOS transistor TP12 has a source electrode connected to the power supply voltage VDD, a drain electrode connected to a second node N12 and a gate electrode connected to the second node N12.

The second NMOS transistor TN12 has a source electrode connected the ground voltage VSS, a drain electrode connected to the second node N12 and a gate electrode connected to the first node N11.

The third PMOS transistor TP13 has a source electrode connected to the power supply voltage VDD, a drain electrode connected to a third node N13 outputting the first intermediate amplified signal BP1 and a gate electrode connected to the second node N12.

The third NMOS transistor TN13 has a source electrode connected the ground voltage VSS, a drain electrode connected to the third node N13 and a gate electrode receiving a bias voltage VB.

As such, the first amplifier 220 may include a diode-connected NMOS transistor, that is, the first NMOS transistor TN11, and the input signal SIN may be applied to the drain electrode of the diode-connected NMOS transistor TN11. In this case, the input signal SIN has an input DC level corresponding to a threshold voltage of the diode-connected NMOS transistor TN11. As a result, the voltage level of the input signal SIN, that is, the voltage level at the first node N11 may be maintained as a threshold voltage of the diode-connected NMOS transistor TN11 when the transmission circuit 100 is disabled and the signal line 10 is not driven.

In addition, the first amplifier 220 may include a diode-connected PMOS transistor, that is, the third PMOS transistor TP13 that generates the first intermediate amplified signal BP1 through the drain electrode thereof. In this case, the first intermediate DC level ILV1 of the first intermediate amplified signal BP1 may be determined based on a threshold voltage of the diode-connected PMOS transistor TP13. As a result, the first intermediate DC level ILV1 of the first intermediate amplified signal BP1, that is, the voltage level at the third node N13 may be maintained as a voltage VDD-Vth where Vth is the threshold voltage of the diode-connected PMOS transistor TP13, when the transmission circuit 100 is disabled and the signal line 10 is not driven. The first amplifier 220 has a feedback configuration such that the first intermediate amplified signal BP1 is applied to the gate electrode of the first PMOS transistor TP11.

Figure 5:
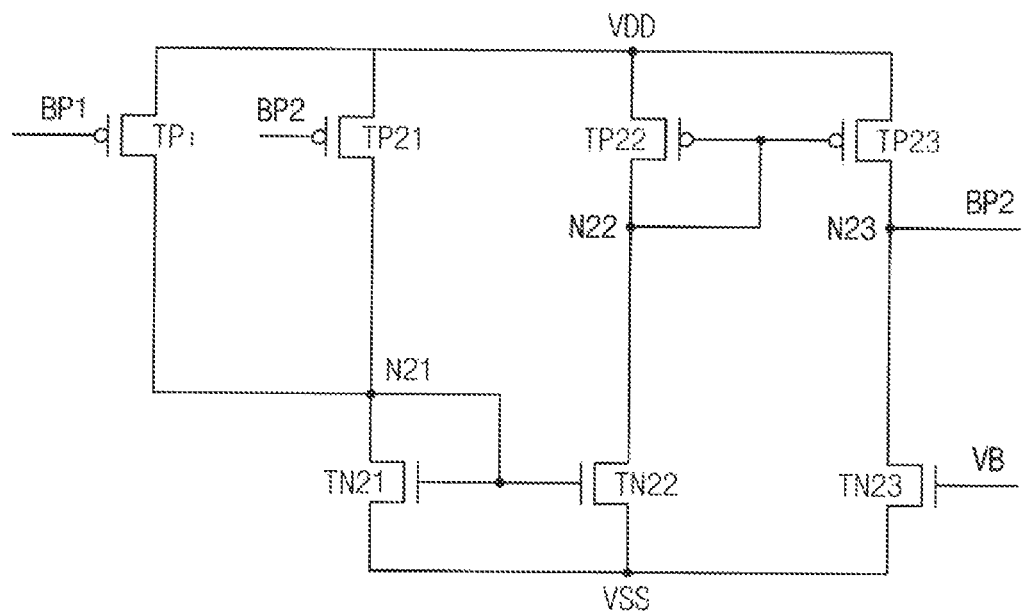
FIG. 5 is a circuit diagram illustrating an example embodiment of a second amplifier included in the conversion circuit of FIG. 3.

FIG. 5 is a circuit diagram illustrating an example embodiment of a second amplifier included in the conversion circuit of FIG. 3.

Referring to FIG. 5, a second amplifier 240 includes an input PMOS transistor TPi, a first PMOS transistor TP11, a second PMOS transistor TP12, a third PMOS transistor TP13, a first NMOS transistor TN11, a second NMOS transistor TN12 and a third NMOS transistor TN13.

The input PMOS transistor TPi has a source electrode connected to a power supply voltage VDD, a drain electrode connected to a first node N21 and a gate electrode receiving the first intermediate amplified signal BP1.

The first PMOS transistor TP21 has a source electrode connected to the power supply voltage VDD, a drain electrode connected to the first node N21 and a gate electrode receiving the second intermediate amplified signal BP2.

The first NMOS transistor TN21 has a source electrode connected a ground voltage VSS, a drain electrode connected to the first node N21 and a gate electrode connected to the first node N21.

The second PMOS transistor TP22 has a source electrode connected to the power supply voltage VDD, a drain electrode connected to a second node N22 and a gate electrode connected to the second node N22.

The second NMOS transistor TN22 has a source electrode connected the ground voltage VSS, a drain electrode connected to the second node N22 and a gate electrode connected to the first node N21.

The third PMOS transistor TP23 has a source electrode connected to the power supply voltage VDD, a drain electrode connected to a third node N23 outputting the second intermediate amplified signal BP2 and a gate electrode connected to the second node N22.

The third NMOS transistor TN23 has a source electrode connected the ground voltage VSS, a drain electrode connected to the third node N23 and a gate electrode receiving a bias voltage VB.

As such, the second amplifier 240 may include a PMOS transistor, that is, the input PMOS transistor TPi, and the first intermediate amplified signal BP1 may be applied to the gate electrode of the PMOS transistor TPi. Accordingly, the second intermediate amplified signal BP2 corresponds to an inverted and amplified signal of the first intermediate amplified signal BP1.

In addition, the second amplifier 240 may include a diode-connected PMOS transistor, that is, the third PMOS transistor TP23 that generates the second intermediate amplified signal BP2 through the drain electrode thereof. In this case, the second intermediate DC level ILV2 of the second intermediate amplified signal BP2 may be determined based on a threshold voltage of the diode-connected PMOS transistor TP23. As a result, the second intermediate DC level ILV2 of the second intermediate amplified signal BP2, that is, the voltage level at the third node N23 may be maintained as a voltage VDD-Vth where Vth is the threshold voltage of the diode-connected PMOS transistor TP23, when the transmission circuit 100 is disabled and the signal line 10 is not driven. The second amplifier 240 has a feedback configuration such that the second intermediate amplified signal BP2 is applied to the gate electrode of the first PMOS transistor TP21.

In some example embodiments, the first amplifier 220 of FIG. 4 and the second amplifier 240 of FIG. 5 may have the same operational characteristics. For this, the sizes of the transistors and the bias voltage VB in the first amplifier 220 may be equal to those in the second amplifier 240. Particularly the size of the first PMOS transistor TP11 in the first amplifier 220 may be equal to a sum of the sizes of the input PMOS transistor TPi and the first PMOS transistor TP21 in the second amplifier 240.

Figure 6:
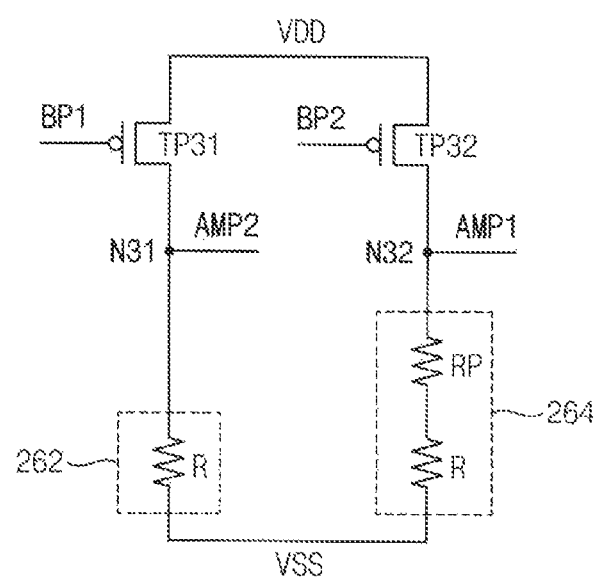
FIG. 6 is a circuit diagram illustrating an example embodiment of a level adjustment circuit included in the conversion circuit of FIG. 3.

FIG. 6 is a circuit diagram illustrating an example embodiment of a level adjustment circuit included in the conversion circuit of FIG. 3.

Referring to FIG. 6, a level adjustment circuit 260 includes a first PMOS transistor TP31, a second PMOS transistor TP32, a first load 262 and a second load 264.

The first PMOS transistor TP31 has a source electrode connected to a power supply voltage VDD, a drain electrode connected to a first node N31 outputting the second output amplified signal AMP2 and a gate electrode receiving the first intermediate amplified signal BP1.

The first load 262 is connected between a ground voltage VSS and the first node N31.

The second PMOS transistor TP32 has a source electrode connected to the power supply voltage VDD, a drain electrode connected to a second node N32 outputting the first output amplified signal AMP1 and a gate electrode receiving the second intermediate amplified signal BP2.

The second load 264 is connected between the ground voltage VSS and the second node N32.

As a result, the first PMOS transistor TP31 and the first load 262 may invert and amplify the first intermediate amplified signal BP1 to generate the second output amplified signal AMP2, and the second PMOS transistor TP32 and the second load 264 may invert and amplify the second intermediate amplified signal BP2 to generate the first output amplified signal AMP1.

As illustrated in FIG. 6, a resistance value R of the first load 262 may be smaller than a resistance value R+RP of the second load 264. If the first intermediate DC level ILV1 is equal to the second intermediate DC level ILV2 and the size of the first PMOS transistor TP31 is equal to the size of the second PMOS transistor TP32, the same current I flows through the first PMOS transistor TP31 and the second PMOS transistor TP32. In this case, the IR drop or the ohmic drop through the first load 262 is I*R and the IR drop through the second load 264 is I*(R+RP). As such, the level adjustment circuit 260 may adjust the first output DC level OLV1 and the second output DC level OLV2 using the first load 262 and the second load 264 of the different values. Although FIG. 6 illustrates a non-limiting example that the first load 262 and the second load 264 are implemented with resistors, the first load 262 and the second load 264 may be implemented with capacitors, inductors, resistors or combinations of them.

Figure 7:
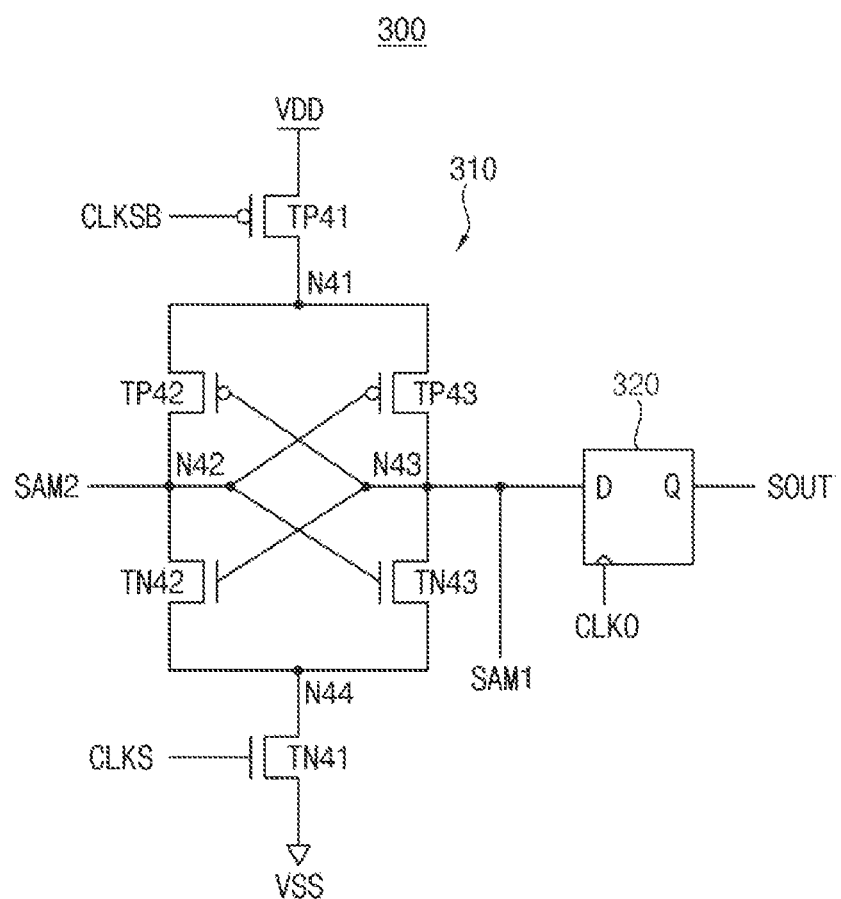
FIG. 7 is a circuit diagram illustrating an example embodiment of a sensing output circuit included in the signal transfer circuit of FIG. 1.

FIG. 7 is a circuit diagram illustrating an example embodiment of a sensing output circuit included in the signal transfer circuit of FIG. 1.

Referring to FIG. 7, a sensing output circuit 300 includes a sense amplifier 310 and a flip-flop 320.

The sense amplifier 310 includes a first PMOS transistor TP41, a second PMOS transistor TP42, a third PMOS transistor TP43, a first NMOS transistor TN41, a second NMOS transistor TN42 and a third NMOS transistor TN43.

The first PMOS transistor TP41 is connected between a power supply voltage VDD and a first node N41 and receives an inverted sensing clock signal CLKSB to a gate electrode thereof. The first NMOS transistor TN41 is connected between a ground voltage VDD and a fourth node N44 and receives a sensing clock signal CLKS to a gate electrode thereof.

The second PMOS transistor TP42 and the second NMOS transistor TN42 form a first inverter, and a second node N42 corresponds to an output node of the first inverter TP42 and TN42. The third PMOS transistor TP43 and the third NMOS transistor TN43 form a second inverter, and a third node N43 corresponds to an output node of the second inverter TP43 and TN43. The inputs and the outputs are cross-connected, and the first inverter TP42 and TN42 and the second inverter TP43 and TN43 form a latch.

During a first half-period while the sensing clock signal CLKS is deactivated to a logic low level, the first PMOS transistor TP41 and the first NMOS transistor TN41 are turned off and the differential signal including the first output amplified signal SAM1 and the second output amplified signal SAM2 is sampled by the latch. During a second half-period while the sensing clock signal CLKS is activated to a logic high level, the first PMOS transistor TP41 and the first NMOS transistor TN41 are turned and the differential signal including the first output amplified signal SAM1 and the second output amplified signal SAM2 is amplified and held by the latch. Such sampling and holding are repeated every cyclic periods of the sensing clock signal CLKS.

The flip-flop 320 samples the data in the latch of the sense amplifier 310 in synchronization with edges of an output clock signal CLKO to provide the output signal SOUT.

Although FIG. 7 illustrates a non-limiting example embodiments of the sensing output circuit based on the differential input, the sensing output circuit is not limited to the configuration of FIG. 7 and may be implemented with various configurations.

Figure 8:
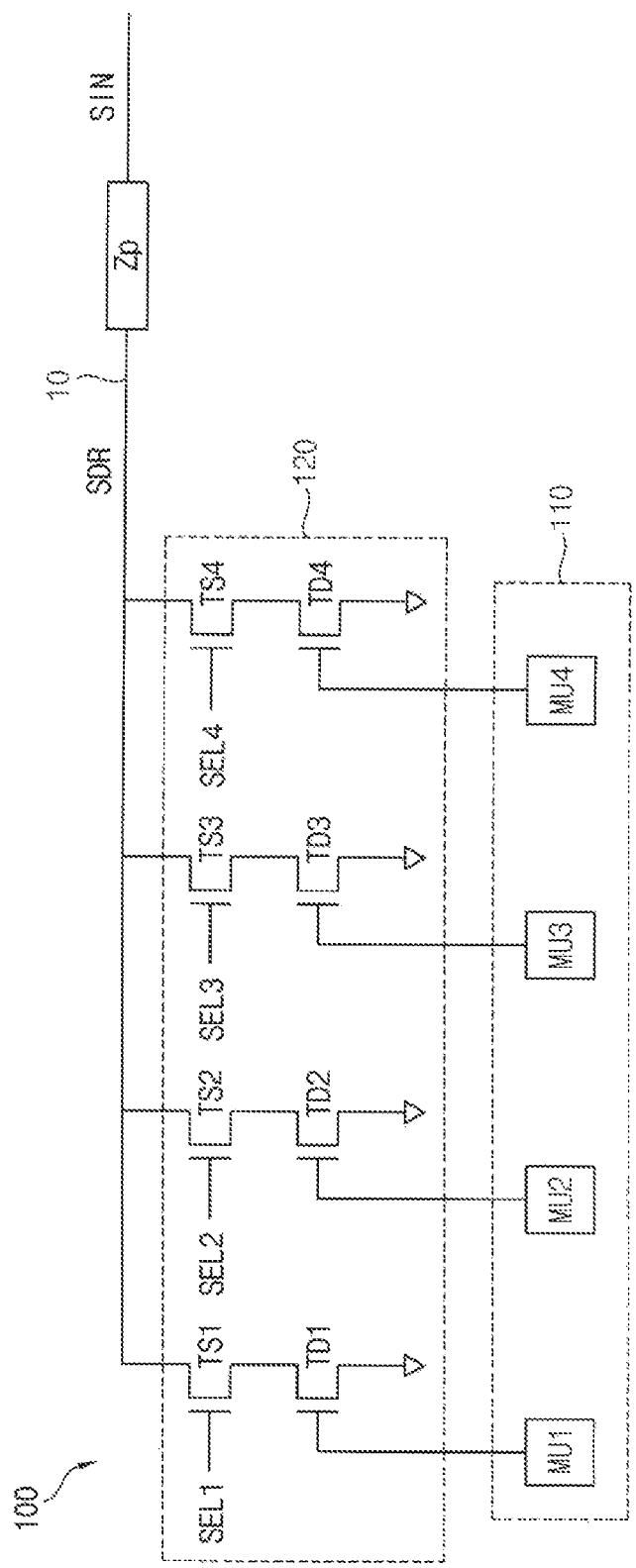
FIG. 8 is a circuit diagram illustrating an example embodiment of a transmission circuit included in the signal transfer circuit of FIG. 1.

FIG. 8 is a circuit diagram illustrating an example embodiment of a transmission circuit included in the signal transfer circuit of FIG. 1.

Referring to FIG. 8, a transmission circuit 100 may include a data storage circuit 110 and a driving circuit 120.

The data storage circuit 110 may include a plurality of memory units MU1~MU4 configured to store a plurality of data bits. FIG. 8 illustrates the four memory units MU1~MU4 for convenience of illustration, and the number of the memory units may be determined variously. The data storage circuit 110 may be implemented with volatile memories such as dynamic random access memory (DRAM), static random access memory (SRAM), etch. and/or non-volatile memories such as magneto-resistive random access memory (MRAM), resistive random access memory (RRAM), phase-change random access memory (PRAM), ferroelectrics random access memory (FRAM), flash memory, etc.

The driving circuit 120 may include a plurality of driving transistors TD1~TD4 and a plurality of selection transistor TS1~TS4, which are connected series between the signal line 10 and a ground voltage, respectively. If the plurality of selection signals SEL1~SEL4 are activated sequentially, the plurality of selection transistors are turned on sequentially and thus the plurality of the driving transistors TD1~TD4 may be connected to the signal line 10 sequentially. The data bits in the plurality of memory units MU1~MU4 may be serialized through such sequential connection and the serialized signal may be provided as the driving signal SDR.

When the bit value stored in each memory unit MUi (i=1, 2, 3 or 4) is "0", the corresponding transistor TDi is turned off. In this case, the signal line 10 is disconnected from the ground voltage even though the corresponding selection transistor TSi is turned on. In contrast, when the bit value stored in each memory unit MUi is "1", the corresponding transistor TDi is turned on. In this case, the signal line 10 is connected electrically to the ground voltage and the voltage level of the signal line 10 falls by a sinking current or a pull-down current if the corresponding selection transistor TSi is turned on.

As such, the transmission circuit 100 may output the driving signal SDR to the signal line 10 by a pull-down scheme. The pull-down driving may reduce the swing width of the driving signal SDR and thus high speed signal transfer may be implemented.

Figure 9:
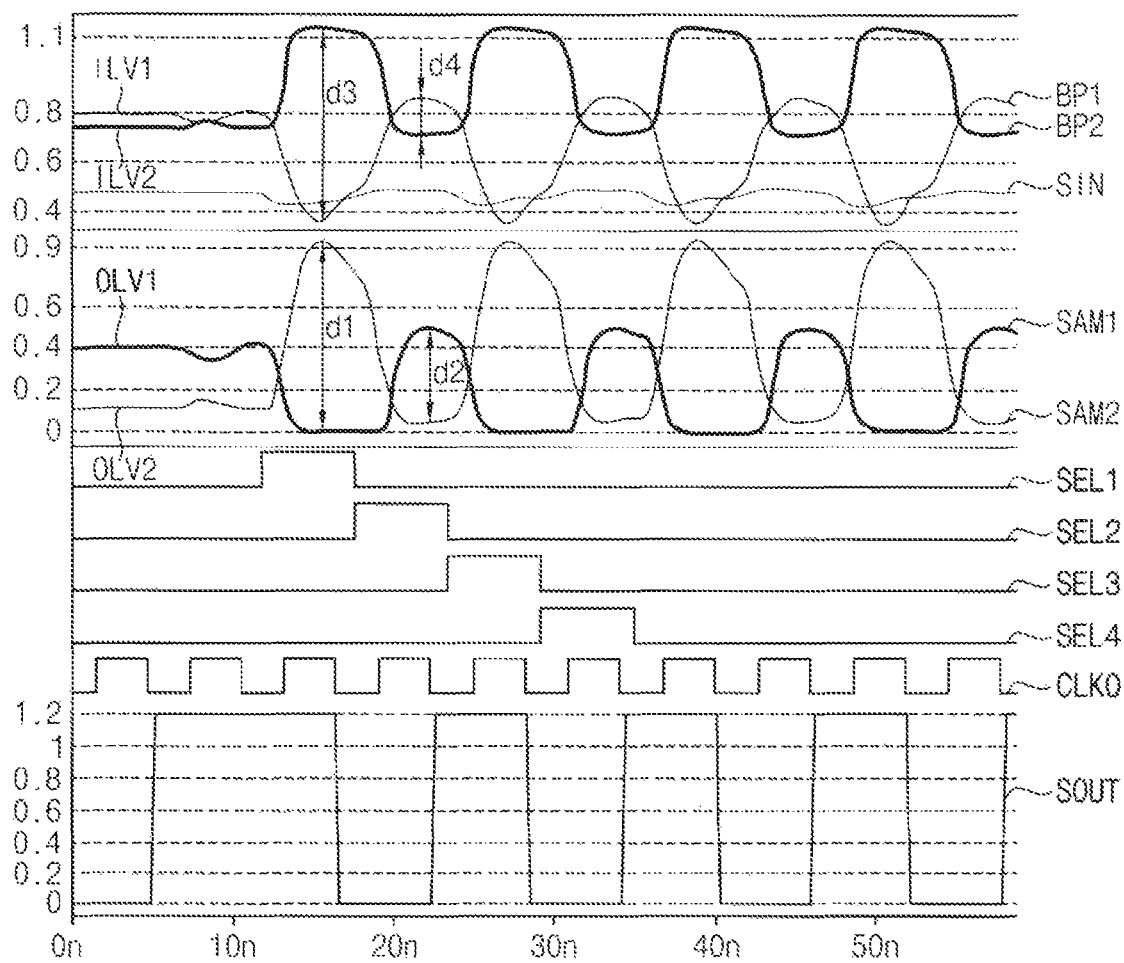
FIG. 9 is a timing diagram illustrating an example operation of a signal transfer circuit according to example embodiments.

FIG. 9 is a timing diagram illustrating an example operation of a signal transfer circuit according to example embodiments.

FIG. 9 illustrates an example operation corresponding to example embodiments of FIGS. 3 through 8. In FIG. 9, the vertical axis represents a voltage by the unit of volt and the horizontal axis represents a time in the unit of nanosecond.

Referring to FIGS. 3 through 9, the selection signals SEL1~SEL4 are activated sequentially and the voltage level of the input signal SIN may be pulled down or recovered depending on the data bits stored in the memory units MU1~MU4. As described above, the swing width of the input signal SIN may be small for a high speed operation.

The first amplifier 220 and the second amplifier 240 generate the first intermediate amplified signal BP1 and the second intermediate amplified signal BP2 by amplifying the input signal SIN. The first intermediate DC level ILV1 of the first intermediate amplified signal BP1 and the second intermediate DC level ILV2 of the second intermediate amplified signal BP2 may be implemented ideally to be equal, but a small difference may exist between them as illustrated in FIG. 9 due to fluctuations in manufacturing processes and so on. Is some cases, the smaller difference d4 among the differences d3 and d4 between the first intermediate DC level ILV1 and the second intermediate DC level ILV2 may be insufficient for differential sensing.

The level adjustment circuit 260 may adjust the first intermediate DC level ILV1 of the first intermediate amplified signal BP1 and the second intermediate DC level ILV2 of the second intermediate amplified signal BP2 to generate the first output amplified signal SAM1 and the second output amplified signal SAM2. As described above, the first output amplified signal SAM1 has the first output DC level OLV1 and swings downwardly from the first output DC level OLV1, and the second output amplified signal SAM2 has the second output DC level and swings upwardly from the second output DC level.

As illustrated in FIG. 9, the level adjustment circuit 260 may generate the first output amplified signal SAM1 and the second output amplified signal SAM2 such that the differences d1 and d2 between the first output amplified signal SAM1 and the second output amplified signal SAM2 may be larger than the differences d3 and d4 of the first intermediate amplified signal BP1 and the second intermediate amplified signal BP2. As a result, the smaller difference d4 between the intermediate amplified signals BP1 and BP2 is increased to the smaller difference d2 between the output amplified signals SAM1 and SAM2 that is sufficient for differential sensing.

The sensing output circuit 300 generates the output signal SOUT based on the first output amplified signal SAM1 and the second output amplified signal SAM2 as a differential input. FIG. 9 illustrates a non-limiting example embodiment that the output signal SOUT is synchronized with falling edges of the output clock signal CLKO, and the output signal SOUT may be synchronized with rising edges of the output clock signal CLKO in other example embodiments.

As such, the signal transfer circuit according to example embodiments transfers a single-ended signal through one signal line and generates a differential signal using the single-ended signal for a sensing operation. Thus the number of the signal lines may be reduced without decrease in performance of signal transfer, and sizes of the signal transfer circuit and the device including the signal transfer circuit may be reduced.

Figure 10:
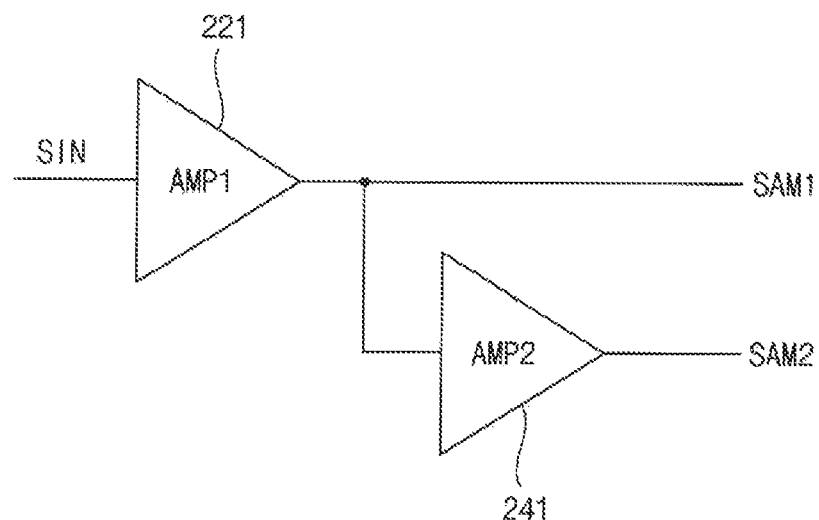
FIG. 10 is a block diagram illustrating a conversion circuit according to example embodiments.

FIG. 10 is a block diagram illustrating a conversion circuit according to example embodiments.

Referring to FIG. 10, a conversion circuit 201 includes a first amplifier AMP1 221 and a second amplifier AMP2 241.

The first amplifier 221 may amplify the input signal SIN to generate the first output amplified signal SAM1. The second amplifier 241 may amplify and invert the first output amplified signal SAM1 to generate the second output amplified signal SAM2. As described above, the first output amplified signal SAM1 has the first output DC level OLV1 and swings downwardly from the first output DC level OLV1, and the second output amplified signal SAM2 has the second output DC level and swings upwardly from the second output DC level.

In the conversion circuit 200 of FIG. 3, the first amplifier 220 and second amplifier 240 mainly perform amplification and inversion operations, and the first output DC level OLV1 of the first output amplified signal SAM1 and the second intermediate DC level OLV2 of the second output amplified signal SAM2 are adjusted using the level adjustment circuit 260. In contrast, in the conversion circuit 201 of FIG. 10, the first amplifier 220 and second amplifier 240 perform the level adjustment of the first output DC level OLV1 and the second output DC level OLV2 in addition to the amplification and inversion operations.

Figure 11:
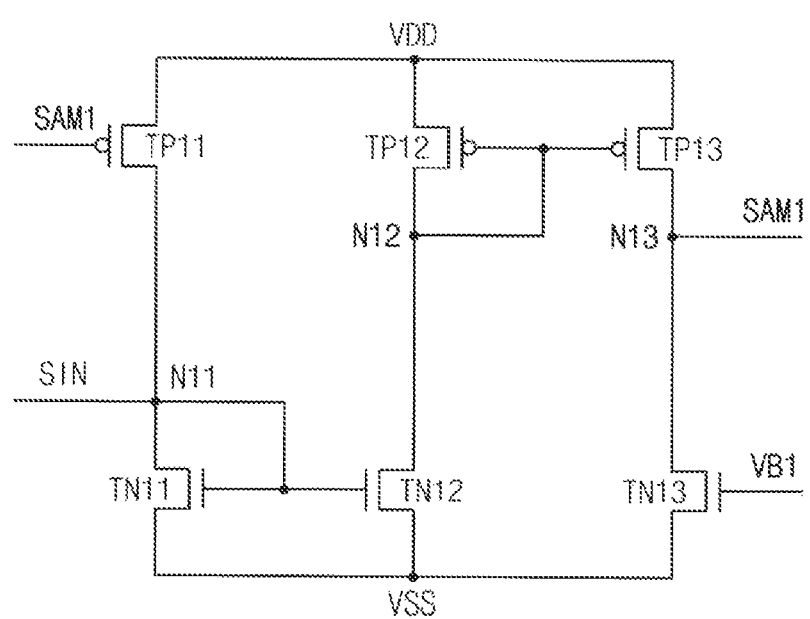
FIG. 11 is a circuit diagram illustrating an example embodiment of a first amplifier included in the conversion circuit of FIG. 10.

FIG. 11 is a circuit diagram illustrating an example embodiment of a first amplifier included in the conversion circuit of FIG. 10.

Referring to FIG. 11, a first amplifier 221 includes a first PMOS transistor TP11, a second PMOS transistor TP12, a third PMOS transistor TP13, a first NMOS transistor TN11, a second NMOS transistor TN12 and a third NMOS transistor TN13.

The first amplifier 221 of FIG. 11 has the same configuration as the first amplifier 220 of FIG. 4 and thus repeated descriptions are omitted. The first intermediate amplified signal BP1 in the first amplifier 220 of FIG. 4 is replaced with the first output amplified signal SAM1 in the first amplifier 221 of FIG. 11.

Figure 12:
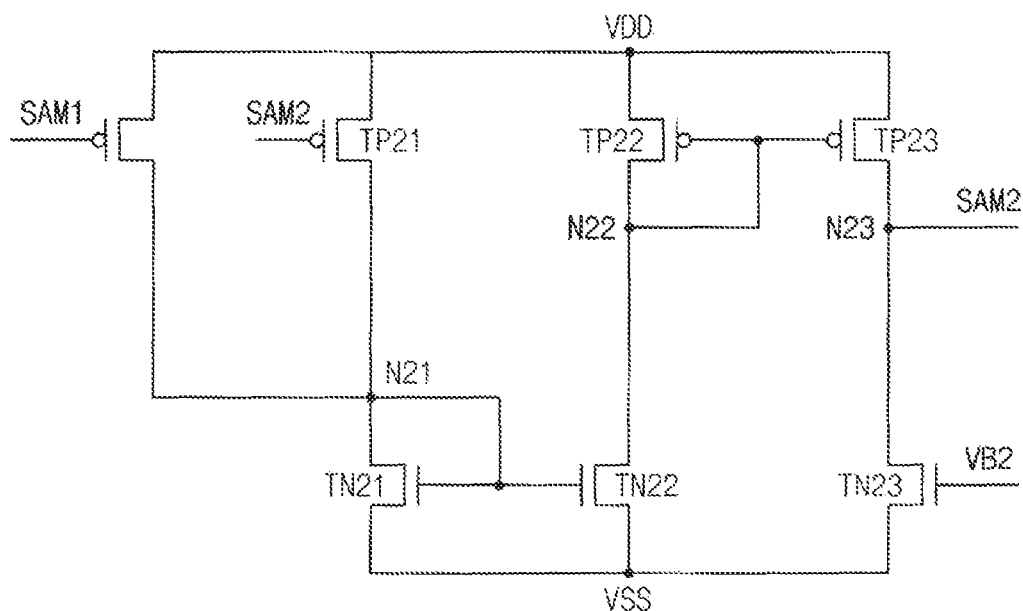
FIG. 12 is a circuit diagram illustrating an example embodiment of a second amplifier included in the conversion circuit of FIG. 10.

FIG. 12 is a circuit diagram illustrating an example embodiment of a second amplifier included in the conversion circuit of FIG. 10.

Referring to FIG. 12, a second amplifier 241 includes an input PMOS transistor TPi, a first PMOS transistor TP11, a second PMOS transistor TP12, a third PMOS transistor TP13, a first NMOS transistor TN11, a second NMOS transistor TN12 and a third NMOS transistor TN13.

The second amplifier 241 of FIG. 12 has the same configuration as the second amplifier 240 of FIG. 5 and thus repeated descriptions are omitted. The first intermediate amplified signal BP1 and the second intermediate amplified signal BP2 in the second amplifier 240 of FIG. 5 are replaced with the first output amplified signal SAM1 and the second output amplified signal SAM2 in the second amplifier 241 of FIG. 12, respectively.

The first amplifier 221 of FIG. 11 and the second amplifier 241 of FIG. 12 may adjust the first output DC level OLV1 and the second output DC level OLV2 using transistors having different threshold voltages or different bias voltages.

In some example embodiments, the first output DC level OLV1 and the second output DC level OLV2 may be adjusted by adjusting a threshold voltage of the diode-connected PMOS transistor TP13 in the first amplifier 221 and a threshold voltage of the diode-connected PMOS transistor TP23 in the second amplifier 241. In other example embodiments, the first output DC level OLV1 and the second output DC level OLV2 may be adjusted by adjusting the bias voltage VB1 applied to the NMOS transistor TN13 in the first amplifier 221 and the bias voltage VB2 applied to the NMOS transistor TN23 in the second amplifier 241.

Figure 13:
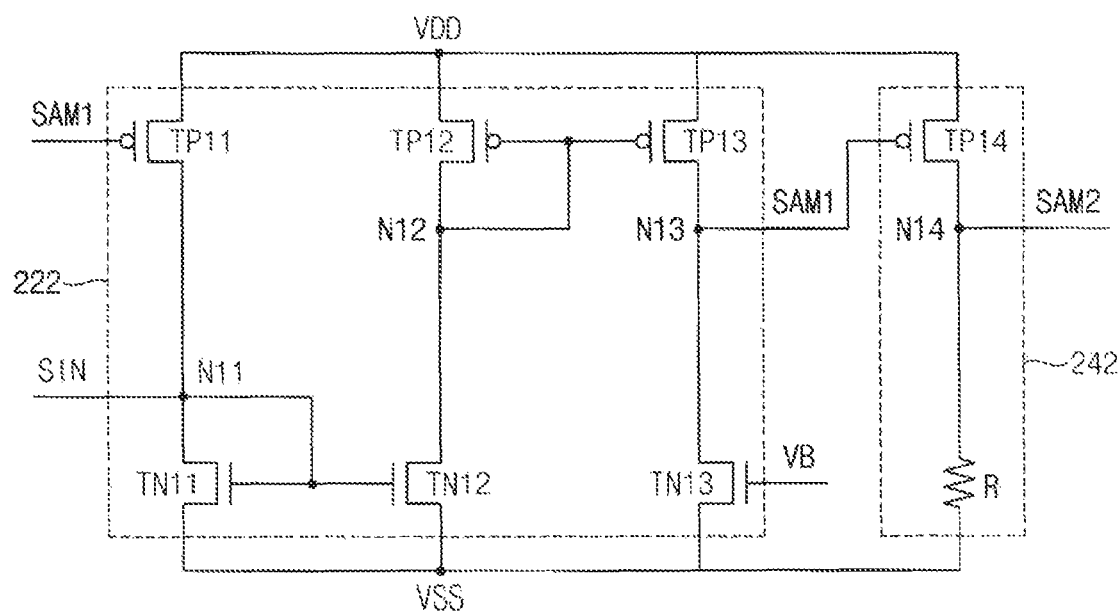
FIG. 13 is a circuit diagram illustrating a conversion circuit according to example embodiments.

FIG. 13 is a circuit diagram illustrating a conversion circuit according to example embodiments.

Referring to FIG. 13, a conversion circuit 202 includes a first amplifier 222 and a second amplifier 242.

The first amplifier 222 may amplify the input signal SIN to generate the first output amplified signal SAM1. The second amplifier 242 may amplify and invert the first output amplified signal SAM1 to generate the second output amplified signal SAM2. As described above, the first output amplified signal SAM1 has the first output DC level OLV1 and swings downwardly from the first output DC level OLV1, and the second output amplified signal SAM2 has the second output DC level and swings upwardly from the second output DC level.

The first amplifier 222 includes a first PMOS transistor TP11, a second PMOS transistor TP12, a third PMOS transistor TP13, a first NMOS transistor TN11, a second NMOS transistor TN12 and a third NMOS transistor TN13.

The first PMOS transistor TP11 has a source electrode connected to a power supply voltage VDD, a drain electrode connected to a first node N11 receiving the input signal SIN and a gate electrode receiving the first output amplified signal SAM1.

The first NMOS transistor TN11 has a source electrode connected a ground voltage VSS, a drain electrode connected to the first node N11 and a gate electrode connected to the first node N11.

The second PMOS transistor TP12 has a source electrode connected to the power supply voltage VDD, a drain electrode connected to a second node N12 and a gate electrode connected to the second node N12.

The second NMOS transistor TN12 has a source electrode connected the ground voltage VSS, a drain electrode connected to the second node N12 and a gate electrode connected to the first node N11.

The third PMOS transistor TP13 has a source electrode connected to the power supply voltage VDD, a drain electrode connected to a third node N13 outputting the first output amplified signal SAM1 and a gate electrode connected to the second node N12.

The third NMOS transistor TN13 has a source electrode connected the ground voltage VSS, a drain electrode connected to the third node N13 and a gate electrode receiving a bias voltage VB.

As such, the first amplifier 222 may include a diode-connected NMOS transistor, that is, the first NMOS transistor TN11, and the input signal SIN may be applied to the drain electrode of the diode-connected NMOS transistor TN11. In this case, the input signal SIN has an input DC level corresponding to a threshold voltage of the diode-connected NMOS transistor TN11. As a result, the voltage level of the input signal SIN, that is, the voltage level at the first node N11 may be maintained as a threshold voltage of the diode-connected NMOS transistor TN11 when the transmission circuit 100 is disabled and the signal line 10 is not driven.

In addition, the first amplifier 222 may include a diode-connected PMOS transistor, that is, the third PMOS transistor TP13 that generates the first output amplified signal SAM1 through the drain electrode thereof. In this case, the first output DC level OLV1 of the first output amplified signal SAM1 may be determined based on a threshold voltage of the diode-connected PMOS transistor TP13. As a result, the first output DC level OLV1 of the first output amplified signal SAM1, that is, the voltage level at the third node N13 may be maintained as a voltage VDD-Vth where Vth is the threshold voltage of the diode-connected PMOS transistor TP13, when the transmission circuit 100 is disabled and the signal line 10 is not driven. The first amplifier 222 has a feedback configuration such that the first output amplified signal SAM1 is applied to the gate electrode of the first PMOS transistor TP11.

The second amplifier 242 includes a fourth PMOS transistor TP14 and a resistor R. The fourth PMOS transistor TP14 has a source electrode connected to the power supply voltage VDD, a drain electrode connected to a fourth node N14 outputting the second output amplified signal SAM2 and a gate electrode connected to the third node N13. The resistor R is connected between the ground voltage VSS and the fourth node N14.

As a result, the second output amplified signal SAM2 generated in the conversion circuit 202 of FIG. 13 corresponds to the second output amplified signal SAM2 illustrated in FIG. 9, and the first output amplified signal SAM1 generated in the conversion circuit 202 of FIG. 13 corresponds to the first intermediate amplified signal BP1 illustrated in FIG. 9. As such, the first output amplified signal SAM1 may be generated using the diode-connected transistor and the feedback configuration as described with reference to FIG. 4, and the second output amplified signal SAM2 may be generated using the IR drop configuration as described with reference to FIG. 6.

Figure 14:
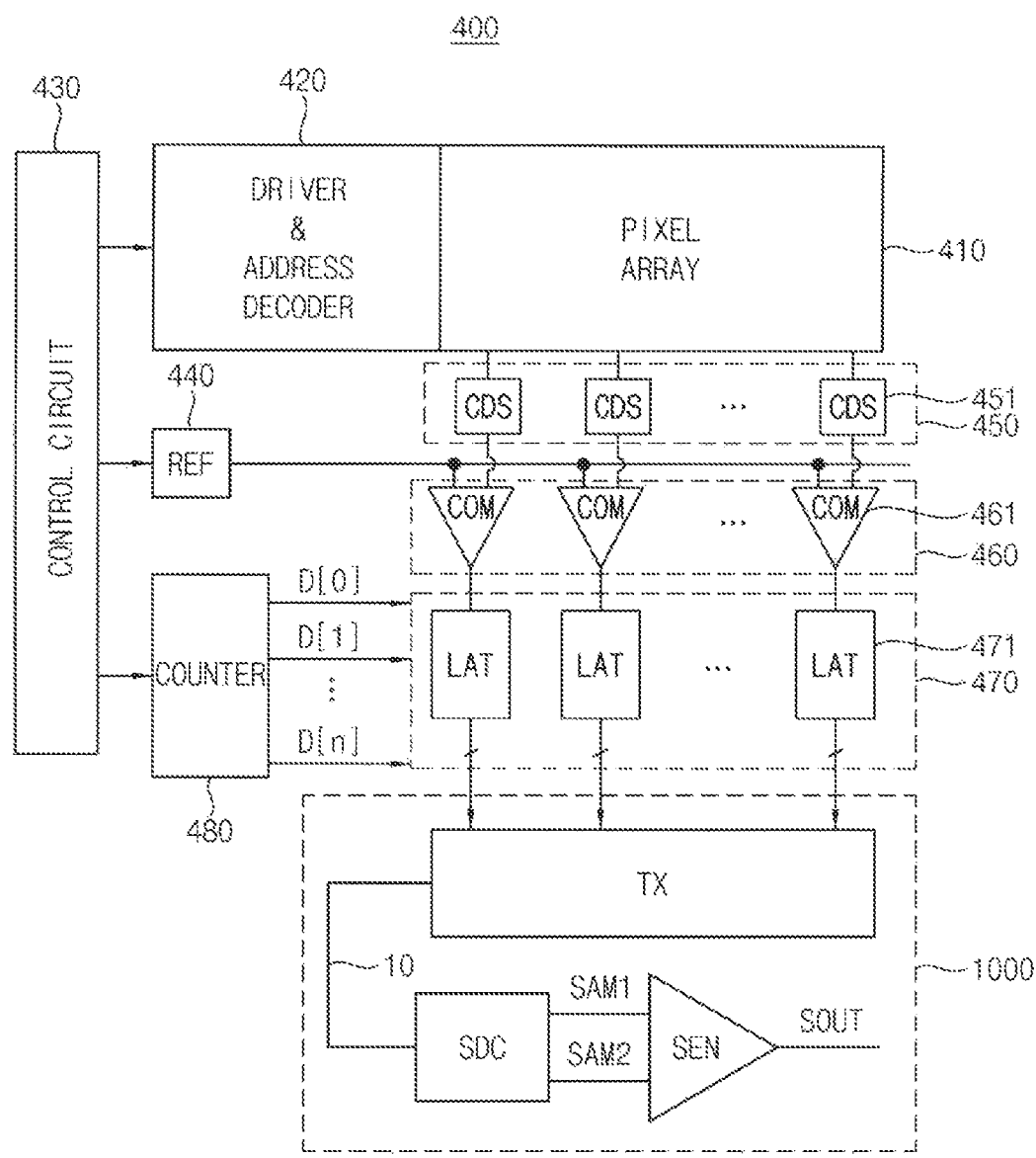
FIGS. 14, 15 and 16 are diagrams illustrating an image sensor according to example embodiments.
Figure 15:
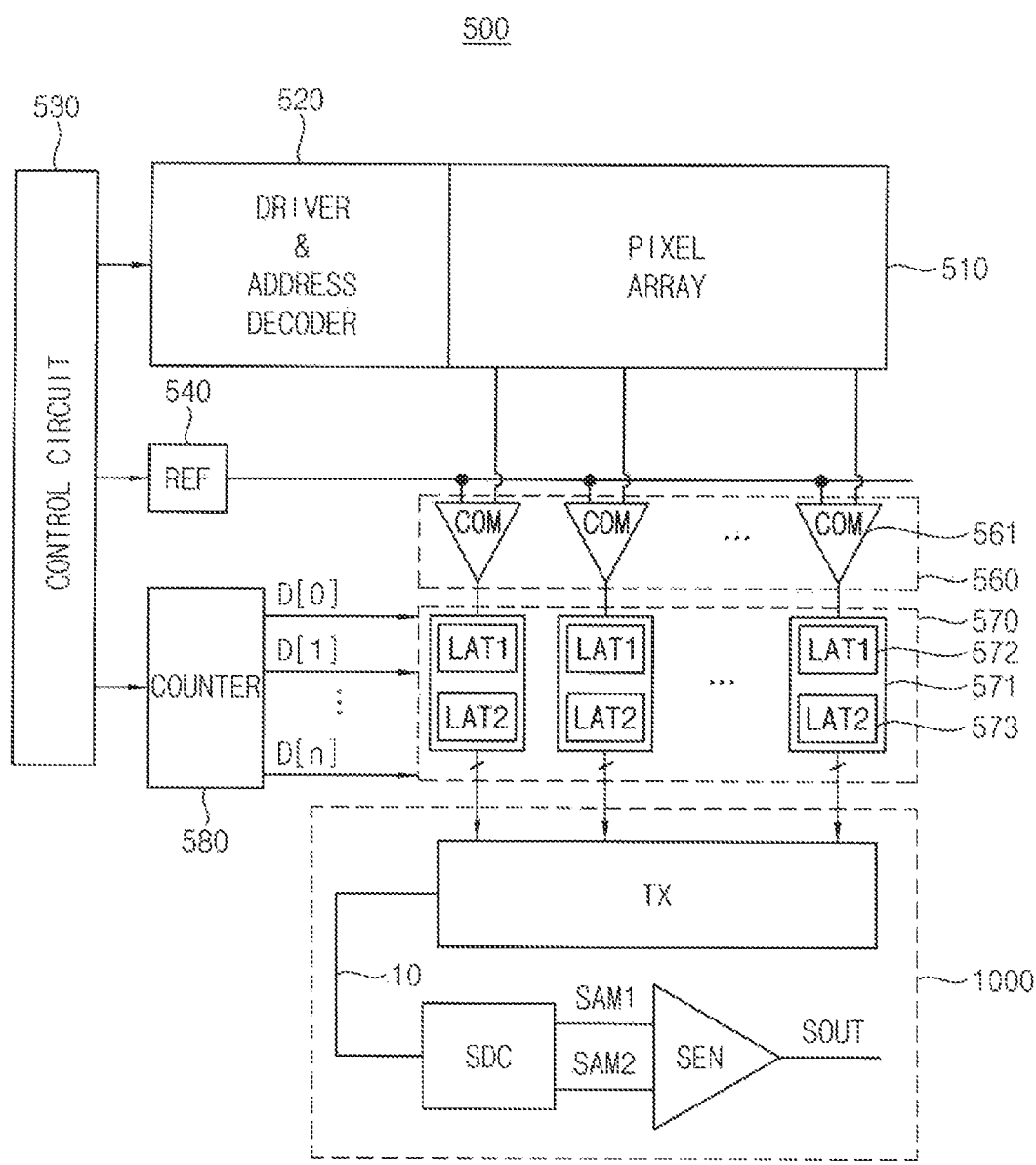
Figure 16:
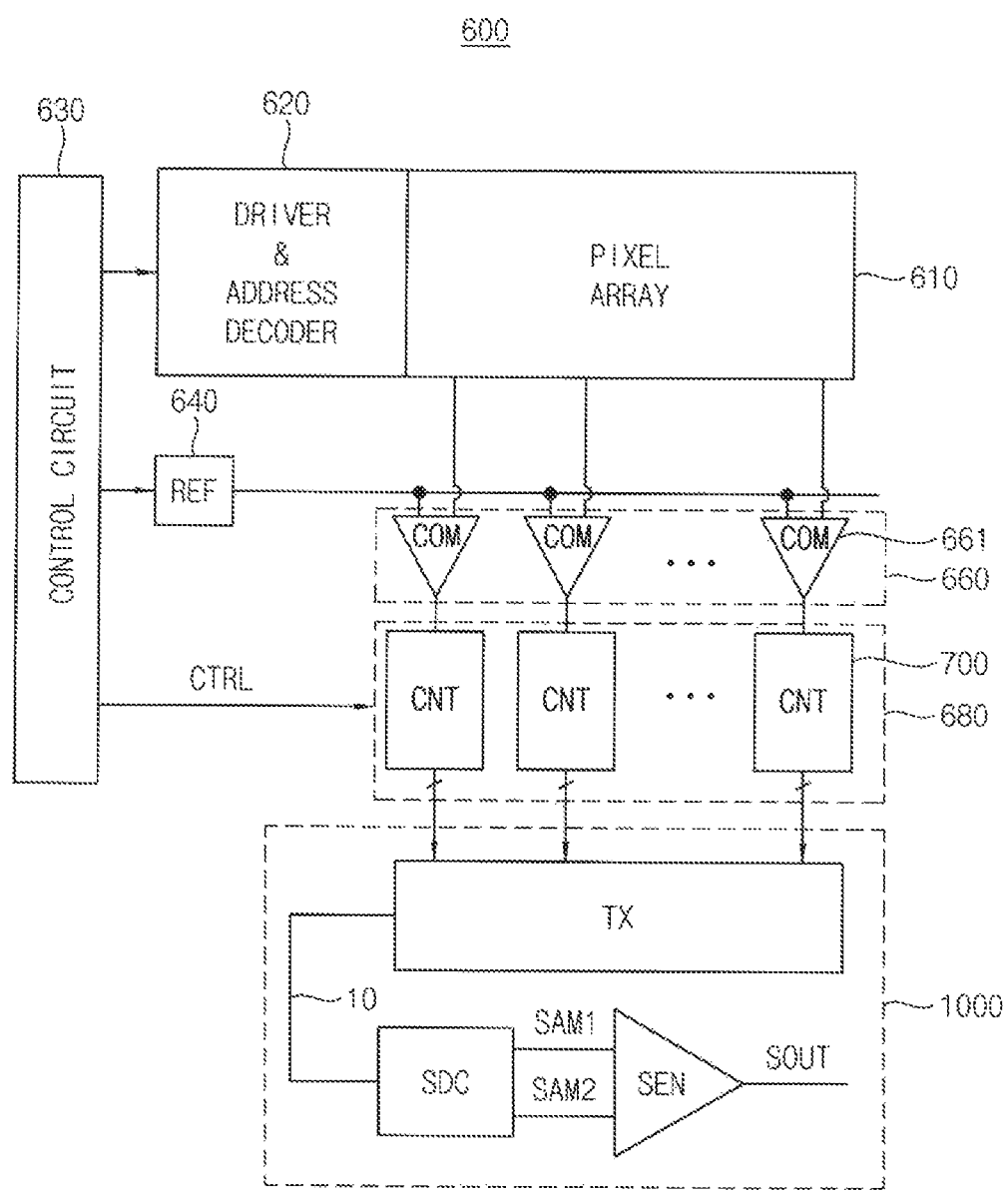

FIGS. 14, 15 and 16 are diagrams illustrating an image sensor according to example embodiments.

Referring to FIG. 14, an image sensor 400 may include a pixel array 410, a driver/address decoder 420, a control circuit 430, a reference signal generator 440, a correlated double sampling (CDS) unit 450, a comparison unit 460, a latch unit 470, a counter 480 and a signal transfer circuit 1000.

In a field of image apparatuses, image sensors of a charge-coupled device (CCD) type or a complementary metal oxide semiconductor (CMOS) type are widely used for capturing an image by sensing incident lights. The image sensor 400 of FIG. 14 may be a CCD image sensor or a CMOS image sensor.

In an example of the CMOS image sensor, the pixel array 410 includes a plurality of pixels for converting incident lights into electrical analog signals. In the image sensor including unit cells referred to as active pixels or gain cells, a respective signal from each pixel is detected by an address control of the pixels. The active pixel sensor is a kind of address-controlled image sensor, and the driver/address decoder 420 controls an operation of the pixel array 410 by unit of a column and/or a row. The control circuit 430 generates control signals for controlling operations of the other components of the image sensor 400.

The analog signals detected by the pixel array 410 are converted into digital signals by an analog to digital converter (ADC) including the comparison unit 460, the latch unit 470, and the counter 480. The analog signals are output typically column by column, and thus the CDS unit 450, the comparison unit 460 and the latch unit 470 include a plurality of CDS circuits 451, a plurality of comparators 461 and a plurality of latches 471 according to the column number of the pixel array 410.

The analog signals output from the pixel array have variations in a reset component due to respective characteristic of each pixel referred to as a fixed pattern noise (FPN) and respective characteristic of each logic circuit for outputting a voltage signal from a corresponding pixel. Accordingly an effective signal component needs to be abstracted by subtracting the respective reset component from the measured signal component. As such, abstracting the effective signal component corresponding to the difference between the reset component and the measured signal component is referred to as CDS.

The CDS unit 450 performs an analog double sampling (ADS) by obtaining the difference between the reset component and the measured signal component using capacitors and switches, and outputs analog signals corresponding to the effective signal components. The comparison unit 460 compares the analog signals output column by column from the CDS unit 450 with the reference signal (e.g., the ramp signal RAMP) from the reference signal generator 440, and outputs comparison signals column by column. The comparison signals have respective transition timings according to respective effective signal component. The bit signals D[0], D[1], D[2] and D[3] from the counter 480 are commonly provided to the latches 471. The latches 471 latch the bit signals in response to the respective comparison signals and output the latched digital signals column by column.

The signal transfer circuit 1000 may be adopted in the image sensor 400 performing the ADS as described with reference to FIG. 14. Also the signal transfer circuit 1000 may be adopted in the image sensors performing a digital double sampling (DDS) as will be described referring to FIGS. 15 and 16. The DDS is one of the CDS where the analog signals corresponding to the reset component and the measured signal component are converted into the digital signals, respectively, and the effective signal component is abstracted by obtaining the difference between the two digital signals.

An image sensor 500 of FIG. 15 has a configuration for performing the DDS whereas the image sensor 400 of FIG. 14 has a configuration for performing the ADS. Each latch 571 coupled to each column includes a first latch 572 and a second latch 573. The pixel array 510 outputs sequentially a first analog signal and a second analog signal for the CDS, where the first analog signal indicates a reset component and the second analog signal indicates a measured image component.

In a first sampling, each comparator 561 compares the first analog signal indicating the reset component with a ramp signal from the reference signal generator 540, and outputs the comparison signal having a transition time point corresponding to the reset component. Such operations are performed with respect to each column. The bit signals D[0], D[1], D[2], D[3] from the counter 580 are commonly provided to each latch 571, and each latch 571 latches the bit signals D[0], D[1], D[2], D[3] at each transition time point of the corresponding comparison signal to store a first count value in the first latch 572.

In a second sampling, each comparator 561 compares the second analog signal indicating the measured image component with the ramp signal from the reference signal generator 540, and outputs the comparison signal having a transition time point corresponding to the measured image component. Such operations are performed with respect to each column. The bit signals D[0], D[1], D[2], D[3] from the counter 580 are commonly provided to each latch 571, and each latch 571 latches the bit signals D[0](or D0), D[1], D[2], D[3] at each transition time point of the corresponding comparison signal to store a second count value in the second latch 573. The first and second count values stored in the first and second latches 572 and 573 are provided to internal logic circuits to calculate values corresponding to the effective image components. As such, the DDS may be performed by the image sensor 500.

The image sensors 400 and 500 of FIGS. 14 and 15 include the common counter for performing the CDS. Also an image sensor may include a plurality of counters coupled to column by column as illustrated in FIG. 16, which may be referred to as column counters.

Referring to FIG. 16, an image sensor 600 may include a pixel array 610, a driver/address decoder 620, a control circuit 630, a reference signal generator 640, a comparison unit 660, a counting block 680 and a signal transfer circuit 1000.

The analog signals detected by the pixel array 610 are converted into digital signals by an ADC including the comparison unit 660 and the counting block 680. The analog signals are output column by column, and thus the comparison unit 660 and counting block 680 include a plurality of comparators 661 and a plurality of counters 700 according to the column number of the pixel array 610. Using the plurality of comparators 661 and counters 700 coupled to each column, the image sensor 600 may simultaneously process a plurality of pixel signals corresponding one row, thereby enhancing an operation speed and reducing noises.

The pixel array 610 outputs sequentially a first analog signal and a second analog signal for the CDS, where the first analog signal indicates a reset component and the second analog signal indicates a measured image component. Based on the first and second analog signals, the ADC including the comparison unit 660 and the counting block 680 performs the CDS digitally, that is, performs the DDS with respect to the respective columns.

Each of the image sensors of FIGS. 14, 15 and 16 includes the signal transfer circuit 1000 according to example embodiments. The signal transfer circuit 1000 includes a transmission circuit TX, a conversion circuit SDC and a sensing output circuit SEN as described above. The conversion circuit 200 converts the input signal SIN, that is a single-ended signal transferred through the signal line 10, to a differential signal including a first output amplified signal SAM1 and a second output amplified signal SAM2. The sensing output circuit 300 generate an output signal SOUT based on the differential signal SAM1 and SAM2.

As such, the image sensor including the signal transfer circuit 1000 according to example embodiments transfers a single-ended signal through one signal line and generates a differential signal using the single-ended signal for a sensing operation. Thus the number of the signal lines may be reduced without decrease in performance of signal transfer, and sizes of the signal transfer circuit 1000 and the image sensor including the signal transfer circuit 1000 may be reduced.

Although the example embodiments of the image sensor including the signal transfer circuit have been described, it would be understood that the signal transfer circuit according to example embodiments may be applied to arbitrary devices and systems requiring high-speed signal transfer.

Figure 17:
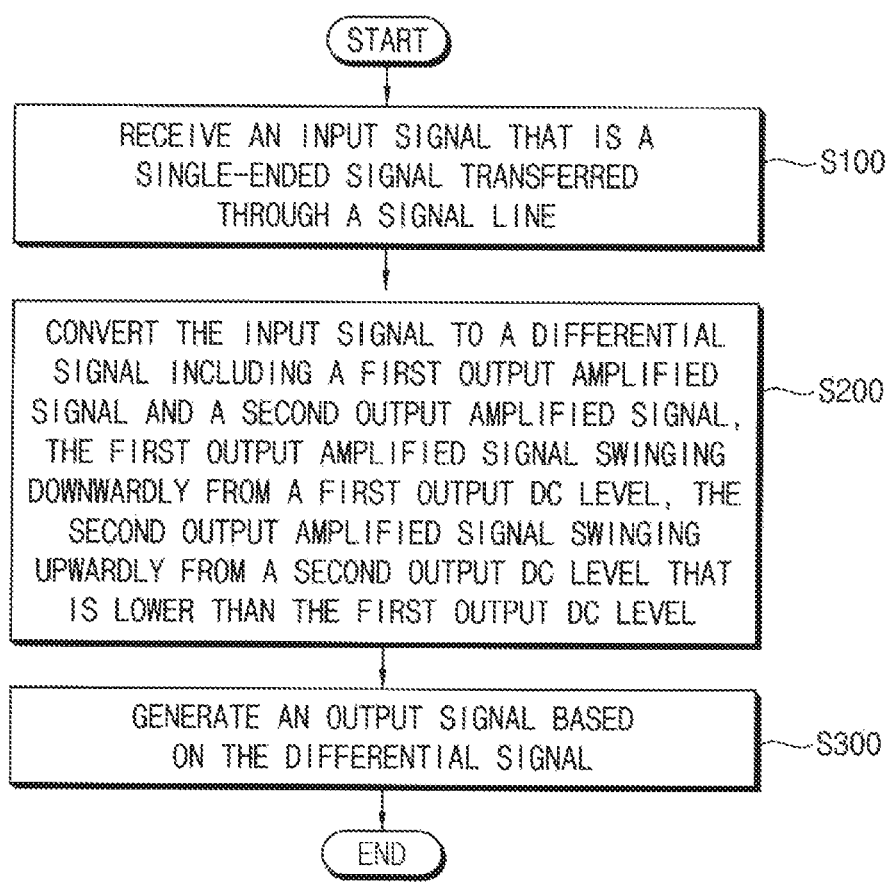
FIG. 17 is a flow chart illustrating a method of transferring a signal according to example embodiments.

FIG. 17 is a flow chart illustrating a method of transferring a signal according to example embodiments.

Referring to FIG. 17, an input signal that is a single-ended signal transferred through a signal line is received (S100). The input signal is converted to a differential signal including a first output amplified signal and a second output amplified signal, such that the first output amplified signal swings downwardly from a first output DC level and the second output amplified signal swings upwardly from a second output DC level that is lower than the first output DC level (S200). The output signal is generated based on the differential signal (S300).

In some example embodiments, as described with reference to FIGS. 3 through 9, the input signal may be amplified using the first amplifier to generate a first intermediate amplified signal that swings downwardly from a first intermediate DC level, and the first intermediate amplified signal may be amplified using the second amplifier to generate a second intermediate amplified signal that swings upwardly from a second intermediate DC level, Using the level adjustment circuit, the first intermediate DC level of the first intermediate amplified signal and the second intermediate DC level of the second intermediate amplified signal may be adjusted to generate the first output amplified signal and the second output amplified signal.

In some example embodiments, as described with reference to FIGS. 10 through 13, the input signal may be amplified using the first amplifier to generate the first output amplified signal, and the first output amplified signal may be amplified and inverted using the second amplifier to generate the second output amplified signal.

The signal transfer circuit, the device including the signal transfer circuit and the signal transfer method according to example embodiments transfer a single-ended signal through one signal line, and generate a differential signal using the single-ended signal for a sensing operation. Thus the number of the signal lines may be reduced without decrease in performance of signal transfer, and sizes of the signal transfer circuit and the device including the signal transfer circuit may be reduced.

The present inventive concept may be applied to any devices and systems requiring high speed signal transfer. For example, the present inventive concept may be applied to systems such as a memory card, a solid state drive (SSD), a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, etc.

The foregoing is illustrative of example embodiments and is not to be construed as limiting thereof. Although a few example embodiments have been described, those skilled in the art will readily appreciate that many modifications are possible in the example embodiments without materially departing from the present inventive concept.

What is claimed is:

1. A signal transfer circuit comprising:
   a transmission circuit configured to output a driving signal to a signal line;
   a conversion circuit configured to receive an input signal that is a single-ended signal transferred through the signal line, and configured to convert the input signal to a differential signal including a first output amplified signal and a second output amplified signal, the first output amplified signal swinging downwardly from a first output DC level, the second output amplified signal swinging upwardly from a second output DC level that is lower than the first output DC level; and
   a sensing output circuit configured to generate an output signal based on the differential signal,
   wherein the conversion circuit includes:
   a first amplifier configured to amplify the input signal to generate a first intermediate amplified signal that swings downwardly from a first intermediate DC level:
   a second amplifier configured to amplify the first intermediate amplified signal to generate a second intermediate amplified signal that swings upwardly from a second intermediate DC level; and
   a level adjustment circuit configured to adjust the first intermediate DC level of the first intermediate amplified signal and the second intermediate DC level of the second intermediate amplified signal to generate the first output amplified signal and the second output amplified signal.

2. The signal transfer circuit of claim 1, wherein a difference between the first output DC level and the second output DC level is larger than a difference between the first intermediate DC level and the second intermediate DC level.

3. The signal transfer circuit of claim 1, wherein the first amplifier includes a diode-connected metal oxide semiconductor (NMOS) transistor, and
   the input signal is applied to a drain electrode of the diode-connected NMOS transistor.

4. The signal transfer circuit of claim 3, wherein the input signal has an input DC level corresponding to a threshold voltage of the diode-connected NMOS transistor.

5. The signal transfer circuit of claim 1, wherein the second amplifier includes a metal oxide semiconductor (PMOS) transistor, and
   the first intermediate amplified signal is applied to a gate electrode of the PMOS transistor.

6. The signal transfer circuit of claim 1, wherein the first amplifier includes a first diode-connected PMOS transistor having a drain electrode to which the first intermediate amplified signal is applied, and
   the second amplifier includes a second diode-connected PMOS transistor having a drain electrode to which the second intermediate amplified signal is applied.

7. The signal transfer circuit of claim 6, wherein the first intermediate DC level and the second intermediate DC level are determined based on threshold voltages of the first diode-connected PMOS transistor and the second diode-connected PMOS transistor, respectively.

8. The signal transfer circuit of claim 1, wherein the level adjustment circuit includes resistors having different resistance values to adjust the first output DC level and the second output DC level.

9. The signal transfer circuit of claim 1, wherein the first amplifier includes:
   a first PMOS transistor having a source electrode connected to a power supply voltage, a drain electrode connected to a first node receiving the input signal and a gate electrode receiving the first intermediate amplified signal;
   a first NMOS transistor having a source electrode connected a ground voltage, a drain electrode connected to the first node and a gate electrode connected to the first node;
   a second PMOS transistor having a source electrode connected to the power supply voltage, a drain electrode connected to a second node and a gate electrode connected to the second node;
   a second NMOS transistor having a source electrode connected the ground voltage, a drain electrode connected to the second node and a gate electrode connected to the first node;
   a third PMOS transistor having a source electrode connected to the power supply voltage, a drain electrode connected to a third node outputting the first intermediate amplified signal and a gate electrode connected to the second node; and
   a third NMOS transistor having a source electrode connected the ground voltage, a drain electrode connected to the third node and a gate electrode receiving a bias voltage.

10. The signal transfer circuit of claim 1, wherein the second amplifier includes:
    an input PMOS transistor having a source electrode connected to a power supply voltage, a drain electrode connected to a first node and a gate electrode receiving the first intermediate amplified signal;
    a first PMOS transistor having a source electrode connected to the power supply voltage, a drain electrode connected to the first node and a gate electrode receiving the second intermediate amplified signal;

a first NMOS transistor having a source electrode connected a ground voltage, a drain electrode connected to the first node and a gate electrode connected to the first node;

a second PMOS transistor having a source electrode connected to the power supply voltage, a drain electrode connected to a second node and a gate electrode connected to the second node;

a second NMOS transistor having a source electrode connected the ground voltage, a drain electrode connected to the second node and a gate electrode connected to the first node;

a third PMOS transistor having a source electrode connected to the power supply voltage, a drain electrode connected to a third node outputting the second intermediate amplified signal and a gate electrode connected to the second node; and a third NMOS transistor having a source electrode connected the ground voltage, a drain electrode connected to the third node and a gate electrode receiving a bias voltage.

11. The signal transfer circuit of claim 1, wherein the level adjustment circuit includes:

a first PMOS transistor having a source electrode connected to a power supply voltage, a drain electrode connected to a first node outputting the second output amplified signal and a gate electrode receiving the first intermediate amplified signal;

a first load connected between a ground voltage and the first node;

a second PMOS transistor having a source electrode connected to the power supply voltage, a drain electrode connected to a second node outputting the first output amplified signal and a gate electrode receiving the second intermediate amplified signal; and a second load connected between the ground voltage and the second node.

12. The signal transfer circuit of claim 11, wherein a value of the first load is smaller than a value of the second load.

13. The signal transfer circuit of claim 1, wherein the conversion circuit includes:

a first PMOS transistor having a source electrode connected to a power supply voltage, a drain electrode connected to a first node receiving the input signal and a gate electrode receiving the first output amplified signal;

a first NMOS transistor having a source electrode connected a ground voltage, a drain electrode connected to the first node and a gate electrode connected to the first node;

a second PMOS transistor having a source electrode connected to the power supply voltage, a drain electrode connected to a second node and a gate electrode connected to the second node;

a second NMOS transistor having a source electrode connected the ground voltage, a drain electrode connected to the second node and a gate electrode connected to the first node;

a third PMOS transistor having a source electrode connected to the power supply voltage, a drain electrode connected to a third node outputting the first output amplified signal and a gate electrode connected to the second node;

a third NMOS transistor having a source electrode connected the ground voltage, a drain electrode connected to the third node and a gate electrode receiving a bias voltage;

a fourth PMOS transistor having a source electrode connected to the power supply voltage, a drain electrode connected to a fourth node outputting the second output amplified signal and a gate electrode connected to the third node; and a resistor connected between the ground voltage and the fourth node.

14. An image sensor comprising:

a pixel array including a plurality of pixels configured convert incident lights to electrical analog signals;

an analog-digital converter configured to convert the electrical analog signals to digital data; and a signal transfer circuit configured to transfer the digital data to an external device, wherein the signal transfer circuit comprises:

a transmission circuit configured to output a driving signal to a signal line based on the digital data;

a conversion circuit configured to receive an input signal that is a single-ended signal transferred through the signal line, and configured to convert the input signal to a differential signal including a first output amplified signal and a second output amplified signal, the first output amplified signal swinging downwardly from a first output DC level, the second output amplified signal swinging upwardly from a second output DC level that is lower than the first output DC level; and a sensing output circuit configured to generate an output signal based on the differential signal, wherein the conversion circuit includes:

a first amplifier configured to amplify the input signal to generate a first intermediate amplified signal that swings downwardly from a first intermediate DC level:

a second amplifier configured to amplify the first intermediate amplified signal to generate a second intermediate amplified signal that swings upwardly from a second intermediate DC level; and a level adjustment circuit configured to adjust the first intermediate DC level of the first intermediate amplified signal and the second intermediate DC level of the second intermediate amplified signal to generate the first output amplified signal and the second output amplified signal.

15. A method of transferring a signal, comprising:

receiving an input signal that is a single-ended signal transferred through a signal line;

converting the input signal to a differential signal including a first output amplified signal and a second output amplified signal, the first output amplified signal swinging downwardly from a first output DC level, the second output amplified signal swinging upwardly from a second output DC level that is lower than the first output DC level; and generating an output signal based on the differential signal, wherein the converting the input signal to the differential signal includes: amplifying the input signal to generate a first intermediate amplified signal that swings downwardly from a first intermediate DC level;

amplifying the first intermediate amplified signal to generate a second intermediate amplified signal that swings upwardly from a second intermediate DC level; and adjusting the first intermediate DC level of the first intermediate amplified signal and the second intermediate DC level of the second intermediate amplified signal to generate the first output amplified signal and the second output amplified signal.

16. The method of claim 15, wherein the converting the input signal to the differential signal includes:
   amplifying the input signal to generate the first output amplified signal; and
   amplifying and inverting the first output amplified signal to generate the second output amplified signal.

* * * * *